United States Patent [19]
Troyan

[11] Patent Number: 5,363,329
[45] Date of Patent: Nov. 8, 1994

[54] SEMICONDUCTOR MEMORY DEVICE FOR USE IN AN ELECTRICALLY ALTERABLE READ-ONLY MEMORY

[76] Inventor: Eugeniy Troyan, #19 Burdeinogo Str., Apt. 449, Minsk, Belarus, 220134

[21] Appl. No.: 150,615

[22] Filed: Nov. 10, 1993

[51] Int. Cl.$^5$ ............... G11C 11/40; G11C 13/04
[52] U.S. Cl. ................. 365/184; 365/100; 365/113; 365/148; 365/163; 257/2; 257/3; 257/4; 257/5
[58] Field of Search ............ 257/2, 3, 4, 5, 52, 257/55, 68; 365/100, 104, 113, 148, 163, 145, 149, 184

[56] References Cited
U.S. PATENT DOCUMENTS
4,203,123  5/1980  Shanks ..................... 257/2

Primary Examiner—Eugene R. LaRoche
Assistant Examiner—F. Niranjan
Attorney, Agent, or Firm—Polster, Lieder, Woodruff & Lucchesi

[57] ABSTRACT

This disclosure relates to an electrically alterable memory device which can be switched from a high resistance state to a low resistance state. The device increases the concentration of electrically active impurities at correspondent electrode to which respective impurities would migrate during a large number of set-reset cycles. This lessens the decline in the threshold voltage caused by the electromigration of those impurities. The device includes a layered structure in which a layer rich in electrically active impurities is placed between memory material layer and its respective electrode and another layer. A fitted thin layer of dielectric is placed between a memory material layer and the other electrode. The memory layer includes an interface of chalcogenide films. A tellurium layer with a concentration of electrically active impurity 2.5%–4.5% is placed between the memory layer and one of the electrodes while a germanium and tellurium or stanus and tellurium layer, with approximate percentage 1:1 and containing an intermediate layer of dielectric having fitted negative charge not less than $10^{19} sm^{-3}$, is placed between the memory layer and the other electrode.

12 Claims, 3 Drawing Sheets

SEMICONDUCTOR MEMORY DEVICE FOR USE IN AN ELECTRICALLY ALTERABLE READ-ONLY MEMORY

BACKGROUND OF THE INVENTION

1. Field of the Invention

This invention relates to an electrically alterable read-only memory and more particularly to an improved thin film semiconductor memory device for use in an electrically alterable read-only memory.

2. Description of the Prior Art

Most semiconductor memory cells are volatile in the sense that data is lost in the event of a power failure. However, it has been discovered that certain amorphous semiconductor materials are capable of being switched to and from a low resistance crystalline state in order to provide a non-volatile memory cell. Particular materials that may be employed for this purpose are disclosed in Ovshinsky U.S. Pat. No. 3,271,591 and Neale U.S. Pat. No. 3,699,543. Such materials are a tellurium based chalcogenide class materials which have the general formula:

$$Ge_A Te_B X_C Y_D$$

and are commonly referred to as "Ovonic" materials. Such high resistance semiconductor materials have a multi-constituent memory layer and can be placed between a pair of spaced apart electrodes such that the application to one of those electrodes of a voltage pulse of appropriate duration and volume produces a relatively low resistance filamentous crystalline path (set operation). A reset set of pulses of appropriate value and duration causes the crystalline path to return to a high resistance state (reset operation).

It has also been discovered that it is possible to obtain a non-volatile memory cell on the basis of a chalcogenide semiconductor that contains a lesser number of components. However, a thin layer of dielectric should additionally be placed between one of the electrodes and the memory layer. Soviet Union Patent No. 1081667 discloses non-volatile memory device in which a thin layer of dielectric, with thickness of 5.0–6.0 nm, was placed between an amorphous memory material layer on the basis of a two-component semiconductor and one of the electrodes. In Bernede's and Conan's work, *J.Phys.D.: Appl. Phys.* V.16, 1983, p.1307–1310, the switching effect in layered structures with an intermediate barrier layer is identified as being conditioned on a negative charge fitted into a thin layer of dielectric.

The prior-art designs of Ovonic memory switches have had a characteristic threshold voltage ($V_{thf}$) which declines continuously throughout the life of the switch. However, there are instances (Buckley U.S. Pat. No. 3,886,577 and Bluhm U.S. Pat. No. 4,115,872) where it appears that the devices lasted throughout $10^6$ set-reset cycles and the threshold voltage was relatively invariant to additional write cycles.

In the above mentioned Bluhm patent, it was disclosed that electromigration of the constituents of the memory material toward different electrodes causes the steady decline of threshold voltage ($V_{thf}$). This migration of materials produces regions that are inactive the switching process because constituent ratios are no longer appropriate. As a result, the region where the ratio of constituents is appropriate for switching is thus reduced in effective thickness and the threshold voltage ($V_{thf}$) becomes low, similar to that of a much thinner layer.

To remove this undesirable effect, the Bluhm patent prefers the use of an Ovonic switch in which the memory layer is placed between the films of tellurium and germanium tellurium. The main idea of the Bluhm invention is to create a region with accumulated constituents of the memory material layer near opposite electrodes toward which diffusion of these constituents takes place. Thus, since the relatively electronegative tellurium migrates to the positive electrode, then near this electrode it is necessary to produce a region accumulated by tellurium. On the other hand, since the relatively electropositive germanium migrates to the negative electrode, then a layer with accumulated germanium should be placed between this negative electrode and the amorphous memory material layer.

While the Bluhm patent was directed to solving problems of electromigration, nothing was disclosed about the influence of electrodiffusion on certain components of the memory layer such as antimony (Sb) and Sulfer (S) and how they effect the characteristics of the memory device. Thus, memory cell embodiment discovered by Bluhm alters the threshold voltage decline but does not eliminate it.

Tellurium is the main constituent of the memory material layer. It is a piezoelectric material in which elastic deformations are pulsing under the influence of external electric fields. These elastic deformations can be caused by internal electric fields which are produced by electrically active impurity centers. *Soviet Crystalographia*, 1992, V. 37, N.5, p.1093–1099 discloses that if a donor-acceptor impurity concentration is rather high (critical), the structure of a piezoelectric material can become unstable due to external and internal effects, and thus undergo various transformations into metastable states. Such metastable states are particularly characteristic at the interface of films. The film interface of tellurium (Te) and germanium tellurium (GeTe) or tellurium (Te) and stanus tellurium (SnTe) have a gradual transition from hexagonal to a cubic structure. Because of the mutual diffusion of the constituents of such films, the gradual succession of this transition is the following: Te-GeTe$_2$, SnTe$_2$ (CdI$_2$ type); GeTe, SnTe (NaCl type), that is, a combination that has the structure of CdI$_2$ type appears on the films interfaces.

The present invention discloses a superstructure in the system of dislocations or vacancies that can appear on the film interface of Te-GeTe, Te-Sn Te under certain circumstances. In such case, a gradual transition from the hexagonal tellurium structure to the cubic structure GeTe, SnTe (NaCl type) can be developed by taking into account the occupancy of the structural positions and the presence of the vacancies. With certain vacancy concentrations, a superstructure of CdI$_2$ is realized; if all of the vacancies are occupied, it leads to a NaCl type structure. Hence, it follows the main operating principle of chalcogenide memory cells, namely, the principle of reversible vacancy occupancy by impurities under the influence of external electric fields. Since the vacancies in chalcogenide semiconductor combinations are the source of the main carriers (holes), by occupying those vacancies with appropriate impurities, as it has been disclosed in the *Japanese Journal Applied Physics*, Pt.1, 1990, V. 29, N.10, p.2098–2102, the films resistance is increased; but when vacancies occur, the rate at which the resistance increases is slowed down. These conclusions are corroborated by various experimental research (*Phil.Mag.*, 1973, V. 27, N.3, p.665–675; J. Non-Cryst. Sol., 1972, V 0.2, p.358–366). These articles point out that a crystal filament responsible for a low resistance state differs by its ratio of constituents from the surrounding amorphous memory layer, dependent upon the impoverishment of certain constituents, for example, antimony (Sb), Arsenic (As), Sulfer (S), and/or Selenium (Se).

The present invention discloses that the main criterion for the formation of a superstructural vacancy regulation system is that the concentration of the impurities should be sufficient for the manifestation of dipole-dipole interaction. This interaction produces rather powerful (critical) internal electric fields which are in common with the external electric fields that will lead, as has been indicated above, to metastable structural transformations on the films interfaces.

In a memory cell, as described in Bluhm's patent, the memory material layer $Ge_xTe_{1-x}Sb_2S_2$ ($0.15 \times 0.33$) is placed, as it has been mentioned above, between the tellurium layer and semiconductor $Ge_ATe_B$ (A:B 1:1) and this constructive solution leads to or alters the decline of the threshold switching voltage. But, it will be obvious that the memory material layer, with Ge and Te in a ratio of approximately 1:2 placed on the interface of Te and GeTe layers, does not practically differ from the chalcogenide metastable combination $GeTe_2$, $SnTe_2$, with $CdI_2$ type structure. It is possible that Sb and S impurities are electrically active in such a cell as impurities and occupy or vacate the vacancies in the filament region of the memory material layer to create high ohmic or low ohmic state. However, the memory cell discovered by Bluhm is switching as well as from a low resistance (low ohmic) state with the same sign of applied voltage. The same sign of applied voltage with every next set-reset cycle leads to a gradual displacement of electrically active impurities (Sb, S ions) toward attractive poles, thus causing migration into the Te and GeTe films. Also, one can not exclude the possibility that the diffusion processes create a concentration of gradients of Sb and S impurities in the layered structure. All of this will affect the change in the electrical characteristics of memory devices and their life cycle.

It is thus an object of the present invention to provide an improved semiconductor chalcogenide memory device.

It is another object of the present invention to provide an improved semiconductor chalcogenide memory device which is not characterized by a declining threshold voltage.

It is still another object of the present invention to provide a semiconductor chalcogenide memory device which has a relatively constant threshold value over a large number of set-reset cycles.

SUMMARY OF THE INVENTION

Since the instability of threshold voltage ($V_{thf}$) is determined by electromigration of electrically active impurities, this instability, as it has been mentioned in Bluhm's patent, can be eliminated by increasing the concentration of electrically active impurities at a correspondent electrode toward which the impurities migrate (if the impurity is of one type). Thus, this invention is directed toward the making of a layered structure, in which a layer with appropriate concentration of electrically active impurity is placed between the switching layer and the respective electrode.

Also, the invention prefers to use the interface of inorganic films as the switching layer. In the interface of inorganic films, the metastable superlattice in the system of vacancies or dislocations develops under the influence of electric fields. With that in mind, it is preferred to use the interface of chalcogenide films Te-GeTe, Te-SnTe, as will be further explained below.

A tellurium film with a concentration of electrically active impurity (Aluminum (AL), Antimony (Sb), Indium (In), Gallium (GA), Copper (Cu) and others), 2.5% Nd 4.5%, is placed between one of the electrodes and the switching layer. Material of one of the electrodes that has a contact with the tellurium layer can be another source of electrically active impurity. A layer of chalcogenide embodiment GeTe or SnTe, with Ge and Te (Sn and Te) in a ratio of approximately 1:1 with a fitted thin layer of dielectric is placed between the switching layer and the second electrode. A layer of dielectric containing oxygen or fluorine with a fitted negative charge is necessary for the creation of a dipole layer consisting of interacting dipoles on the interface of films Te-GeTe, Te-SnTe. This dipole layer can be created at the expense of the Coloumb interaction with positively charged impurities in the tellurium film.

When the concentration of electrically active impurities (Nd 2.5%) and the quantity of the fitted dielectric charge (Ne $10^{19} sm^{-3}$) are critical, dipole-dipole interaction of cooperative character will result. These conditions are necessary, as was mentioned above, for the development of the memory effect.

It is important to emphasize the polarity dependence of the invented memory device. When switching the memory device into the low resistance state (ON), a pulse of negative polarity voltage and correspondent amplitude is applied to the electrode contacting with a tellurium film. When being restored to the high resistance state (OFF), a pulse of opposite polarity is used. This particular feature eliminates the decline of the threshold voltage of a memory cell as a result of the undesirable electromigration of the constituents of the memory layer.

One feature of the present invention resides in a memory switch having a region of memory material in the form of an interface of semiconductor films placed between spaced-apart electrodes. This region which is rich in electrically active donor impurity is placed between the memory material and one electrode, while a region containing a thin layer of a dielectric with a fitted negative charge is placed between the memory material layer and the other electrode.

An additional feature of the present invention resides in the memory device structure employing the material of one electrode in the capacity of a donor source impurity.

It is still an additional feature of the present invention that resides in a critical quantity of negative charge fitted into a dielectric and a critical concentration of electrically active impurity in the memory material, for the manufacture of the memory device.

DESCRIPTION OF THE DRAWINGS

The above and other objects and advantages of the present invention will become more readily apparent from a review of the following specification when taken in connection with the drawings wherein.

GENERAL DESCRIPTION OF THE INVENTION

As was indicated above, the present invention employs an interface of inorganic films in the capacity of a memory material layer. A metastable superstructure as a system of vacancies or dislocations is formed in this interface. In particular, it is proposed to use the interface of chalcogenide films: Te-GeTe, Te-SnTe. However, the present invention can obviously employ other semiconductor materials, as desired.

Figure 1:
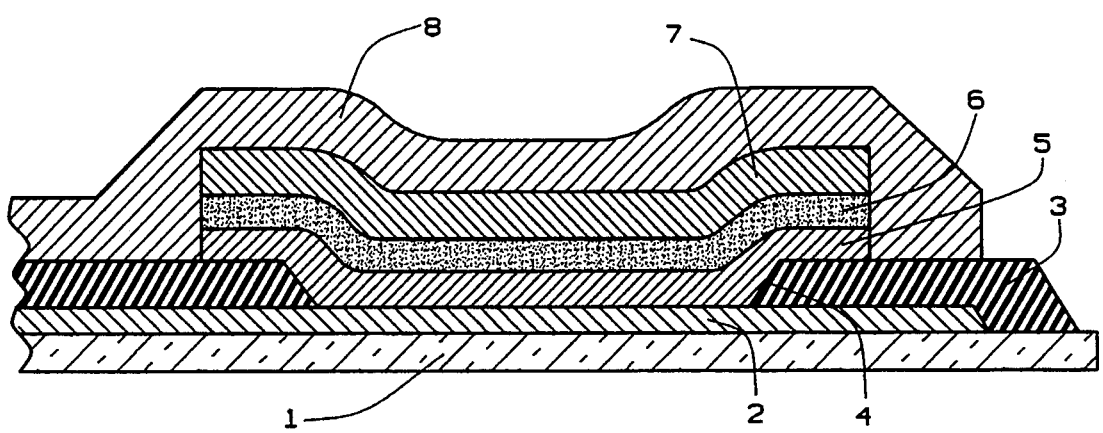
FIG. 1 is an enlarged cross-section of an amorphous memory device of the prior art.

An embodiment of prior art memory device which uses such semiconductor materials is illustrated in FIG. 1. As shown in FIG. 1, the memory device is formed on an insulated substrate 1. Conductor 2 is first formed on insulator layer 1. Another insulator layer 3 is formed thereover with an opening 4 to receive the memory device. Semiconductor GeTe layer 5, with a proportion with germanium and tellurium of 1:1, is deposited over the opening 4. On top of this semiconductor layer 5, the amorphous memory glass material 6 is formed, and then a tellurium layer 7 is deposited over the amorphous memory glass layer 6. The tellurium based layer 7 may contain up to 10% germanium. A second conductor 8 is then formed over the device.

As it has a been disclosed in the above mentioned Bluhm patent, the material of layer 7 is purposely chosen to be tellurium so as to offset the tellurium migration toward the positive electrode during the set and reset cycles. The material of the layer 5 is chosen to be an alloy layer of germanium and tellurium in a ratio or approximately 1:1 so as to offset the germanium migration toward the negative electrode during the set and reset cycles. As was indicated above, while this tends to alter the threshold voltage decline, it does not eliminate it because Bluhm's patent dealt only with the electromigration of the components of the memory layer, namely tellurium and germanium, but did not deal with the other components, such as Sb and S. As will be seen from the discussion that follows, the present invention is designed to provide a much more stable threshold voltage over a much longer life cycle.

Figure 2:
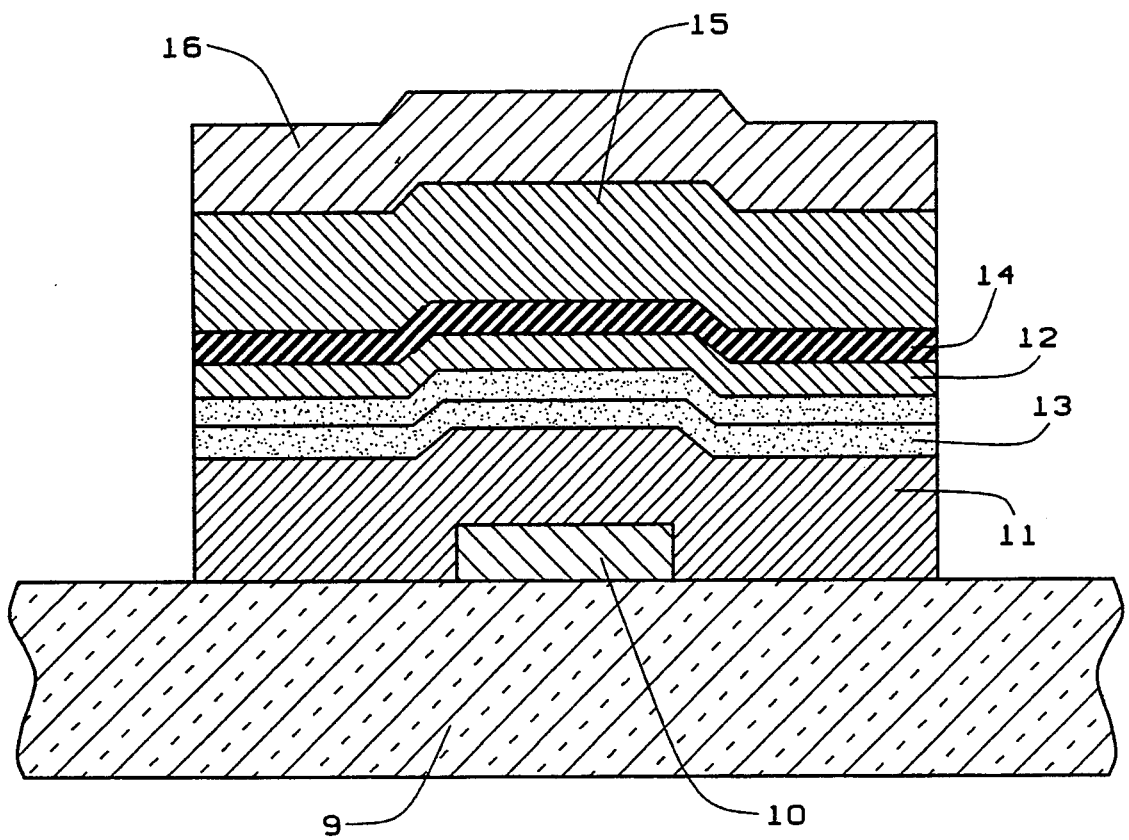
FIGS. 2-3 are enlarged cross-sectional views of the various embodiments of the present invention.

A general embodiment of the present invention is illustrated in FIG. 2. As shown in FIG. 2, the memory device is formed on an insulator layer 9 which may or may not be a semiconductor substrate. Conductor 10 is first formed on insulator layer 9. Molybdenum can be one of the materials for the conductor 10. At this point, the present invention departs markedly from the prior art in that there is deposited, by appropriate techniques, tellurium layer 11 that contains from 2.5% to 4.5% of donor impurity (Al, for example). On top of this layer 11, a germanium-tellurium or stanum-tellurium semiconductor layer 12, with a proportion of the respective constituents of 1:1, is deposited. The thickness of the layer 12 should be within 10-15 nm. One specific feature of the present invention is that when forming the memory material layer 13, no additional technological operation is needed. The memory material is formed on the interface of the layers 11 and 12, by the mutual diffusion of the constituents. Such memory material is a semiconductor of $Ge_{32}Te_{64}Al_4$ or $Sn_{32}Te_{64}Al_4$ type. On top of the layer 12, a layer of dielectric 14 with fitted negative charge is deposited. The quantity of the charge fitted into dielectric layer 14 should be no less than $10^{19} sm^{-3}$. The thickness of the dielectric layer 14 should not be more than 6.0-10.0 nm. Above dielectric layer 14, a semiconductor layer 15, identical by its constituents to the layer 12 is deposited. The thickness of the semiconductor layer 15 can range from 100 nm to 300 nm. The upper layer of conductor 16 completes the formulation of the memory cell.

Figure 3:
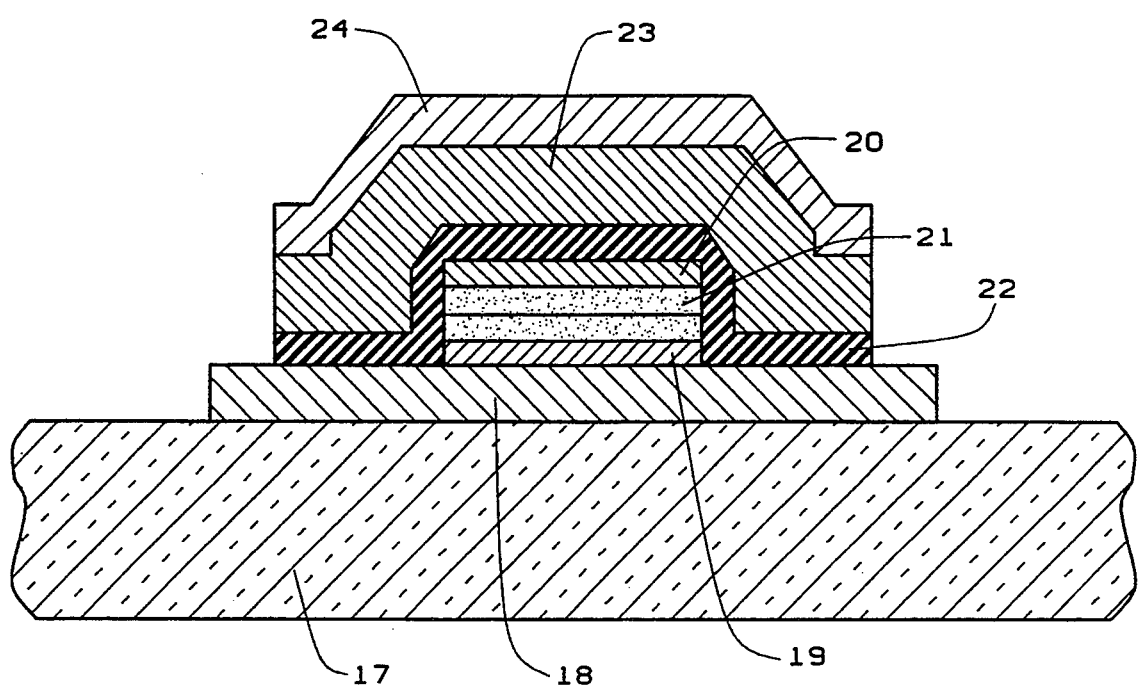

Another specific embodiment of the present invention is illustrated in FIG. 3. This device is similar in structure to the embodiment of FIG. 2, except that the tellurium layer 11 is deposited without any impurity. In this embodiment, the material of the lower electrode 18 on which a tellurium layer 19 of appropriate techniques is deposited is the source of electrically active impurity. As shown in FIG. 3, the device is similarly formed with an insulator substrate 17 which may or may not be a semiconductor material. A lower electrode 18, for example aluminum, is first formed on the insulator layer 17. On top of electrode 18, a tellurium layer 19 and then a semiconductor material 20 containing tellurium (germanium-tellurium or stanum-tellurium) with a proportion of the respective constituents on the order of 1:1, are selectively deposited. The thickness of the layers 19 and 20 should be within 10-15 nm. The memory layer 21 is formed on the interface of the layers 19 and 20 because of the mutual diffussion of their constituents. Then, a thin layer of dielectric 22 with thickness 6.0-10.0 nm is formed on top of selectively deposited layers 19 and 20. The thin layer of dielectric 22 has a quantity of fitted negative charge not less than $10^{19} sm^{-3}$. A semiconductor layer 23, identical by its constituents to the layer 20, is thereafter deposited. The thickness of the layer 23 can range from 100 nm to 300 nm. Finally, an upper layer in the form of a conductor 24 completes the formulation of the memory cell.

The characteristic peculiarity of the memory device in FIG. 3, as well as of the memory device on FIG. 2, is that the fitted negative charge in the layer of dielectric 22 is the main factor determining a critical concentration of electrically active impurity in the memory layer 21. The dielectric layers 14 and 22, in FIG. 2 and FIG. 3 respectively, can be based on a dielectric containing fluorine or oxygen, for example, $MgF_2$, $GeO_2$, $SnO_2$, as well as others. A necessary quantity of the fitted negative charge in the thin dielectric layer 14 or 22 can be obtained by known technological ways, for example, by electron beam or Hf magnetron evaporation or other appropriate method.

In FIG. 3, the semiconductor layers 19, 20 and 23, as well as dielectric layer 22, can be patterned photolithographically in a manner to form the respective active regions. All of the semiconductor layers and the dielectric layer in FIG. 2 are patterned simultaneously, while in FIG. 3, the semiconductor layers 19 and 20 are patterned separately from the semiconductor layer 23 and the dielectric layer 22.

The memory devices illustrated in FIGS. 2 and 3 operate in the following way: When a pulse of negative voltage is applied to the electrode contacting the tellurium film, positively charged ions of an impurity (Al, for example) are displaced from the vacancies they occupy on the films interface and move toward the negative electrode. When the threshold voltage is $V_{thf}$ 5 Volts, a phase transition into a new metastable state (superstructure system of vacancies) with high conductivity takes place at the weakest point of the films interface. The formation of a highly conductive channel (filament of conductivity) leads to a redistribution of the voltage decline on the layered structure. The voltage will be declining basically on the layer of dielectric that favors a field generation of a certain part of negative charge from the dielectric layer toward a positive electrode. If after a power failure the negative charge in the dielectric layer becomes lower than critical, then it will lead to a storage of low ohmic (ON) state (memory effect). Switching of the memory cell to high ohmic (OFF) state is possible only when changing the polarity of applied voltage. In this case, when the threshold voltage is $V_{thr}$ 3.5 Volts, the positively charged ions of the impurity are attracted from the tellurium film in a quantity sufficient to occupy the vacancies in the region of the crystal filament, on the films interface, Te-GeTe or Te-SnTe.

A sharp increase in the resistance will cause redistribution of the voltage decline on the layered structure that will favor accumulation of free charges and electrically active impurities near corresponding high ohmic regions. The negative charge will be accumulated in the dielectric layer and on the interfaces, dielectric-semiconductor and the positive charge (ions of donor impurity) will be accumulated on the films interface, Te-GeTe, Te-SnTe. The quantity of accumulated charges is determined by the quantity of applied back voltage, ($V_{thf}$), At the expense of Coloumb interaction of the opposite critical charges, a dipole layer will be formed. This layer will remain after a power failure. Thus, at the expense of a corresponding quantity of back voltage (voltage of back polarity), one can completely restore the quantity of the direct threshold voltage $V_{thf}$. This raises considerably the temporary stability of the threshold voltage value, ($V_{thf}$).

The duration of the pulses which switch the memory cell to the ON as well as to the OFF state is not more than 1 mks. The OFF state is stable for reverse voltage up to breakdown voltages and for forward voltages of approximately 4 to 5 Volts. At higher forward voltages, the memory cell, as was mentioned above, switches to the ON state. The ON state is stable for forward voltages up to breakdown voltages and for reverse voltages of approximately 3 Volts. At reverse voltages of greater magnitude, the memory cells switch to the OFF state. The number of switching cycles during which the change in the threshold voltage ($V_{thf}$) of the memory cells is not more than 10% greater than $10^8$.

Thus, the threshold value stability of the present invention considerably exceeds that of the prior art. The use of the interface of the chalcogenide films in the capacity of the memory layer makes it possible to bring the switching time up to 1 mks and to decline the threshold voltage ($V_{thf}$) up to 5 Volts instead of 8 Volts as in the prior art.

EPILOGUE

Different embodiments of the present invention have been described above each of which represents a layered structure with a memory layer that is formed on an interface of two regions as the result of the mutual diffusion of their constituents. One of the regions contains an electrically active donor impurity. In the other region, a thin layer of dielectric with fitted negative charge is placed. The memory layer is a two component chalcogenide semiconductor based tellurium in which, when keeping to the certain internal and external conditions, creates a superstructural regulating system of vacancies (memory effect). The internal conditions are: a quantity of negative charge fitted into a thin layer of dielectric and a concentration of electrically active donor impurity in the memory layer.

A certain polarity, amplitude and duration of the applied external voltage causes the decline of the concentration of electrically active impurity in the memory layer and the quantity of the charge fitted into the dielectric that leads to the switching of the present memory device to low ohmic state. Changing of a polarity of the applied voltage of a certain amplitude and duration causes the reduction of concentration of electrically active impurity in the memory layer and the negative charge in the thin layer of dielectric up to the former quantities. This leads to the switching of the memory device to the high ohmic state.

In view of the above, the several objects and advantages of the present invention have been achieved.

I claim:

1. An electrically alterable memory device comprising:
   a lower electrode;
   an upper electrode; and
   a layer structure mounted inbetween said electrodes, which structure is constructed of first, second and third regions, said first region being adjacent to said lower electrode, said third region being adjacent to said upper electrode, said second region being between said first and third regions;
   said second region being formed by the mutual diffusion of the main constituents of the first and third regions in order to provide a higher electrical resistance in one metastable state and lower electrical resistance in other metastable state, with switching from one state to the other upon application to the electrodes of an electrical signal of appropriate polarity, amplitude and duration;
   said first region being formed of a material based tellurium with an electrically active donor impurity;
   said third region being formed of a material having approximately equal percentages of tellurium and germanium or tellurium and stanus and containing inside an intermediate thin film of dielectric with a quantity of a fitted negative charge; and
   said second region being formed because of a mutual diffusion of the main constituents of said first and third regions and have a higher percentage of tellurium than said third region.

2. A memory device according to claim 1 wherein said first region is formed of a material based tellurium containing from 2.5% to 4.5% of electrically active donor impurity.

3. A memory device according to claim 1 wherein the intermediate thin layer of dielectric in the third region has a quantity of a fitted negative charge not less than $10^{19} sm^{-3}$.

4. A memory device according to claim 1 wherein said second region is formed of $Ge_{32}Te_{64}Al_4$.

5. A memory device according to claim 1 wherein said second region is formed of $Sn_{32}Te_{64}Al_4$.

6. An electrically alterable memory device comprising:
   a lower electrode;
   an upper electrode; and
   a layer structure mounted inbetween said electrodes, which structure is constructed of first, second and third regions, said first region being adjacent to said lower electrode, said third region being adjacent to said upper electrode, said second region being between said first and third regions;

said second region being formed by the mutual diffusion of the main constituents of the first and third regions in order to provide a higher electrical resistance in one metastable state and lower electrical resistance in other metastable state, with switching from one state to the other upon application to the electrodes of an electrical signal of appropriate polarity, amplitude and duration;

said first region being formed of a material based tellurium with an electrically active donor impurity in close proximity thereto;

said third region being formed of a material having approximately equal percentages of tellurium and germanium or tellurium and stanus and containing inside an intermediate thin film of dielectric with a quantity of a fitted negative charge; and said second region being formed because of a mutual diffusion of the main constituents of said first and third regions and have a higher percentage of tellurium than said third region.

7. The memory device according to claim 6 wherein the electrically active donor being included in the lower electrode which is adjacent said first region.

8. A memory device according to claim 6 wherein the electrode contains from 2.5% to 4.5% of electrically active donor impurity.

9. A memory device according to claim 6 wherein the intermediate thin layer of dielectric in the third region has with a quantity of a fitted negative charge not less than $10^{19} sm^{-3}$.

10. A memory device according to claim 6 wherein said second region is formed of $Ge_{32}Te_{64}Al_4$.

11. A memory device according to claim 1 wherein said second region is formed of $Sn_{32}Te_{64}Al_4$.

12. An electrically alterable memory device comprising:

a lower electrode;

an upper electrode; and a layer structure mounted inbetween said electrodes, which structure is constructed of first, second and third regions, said first region being adjacent to said lower electrode, said third region being adjacent to said upper electrode, said second region being between said first and third regions;

said second region being formed by the mutual diffusion of the main constituents of the first and third regions in order to provide a higher electrical resistance in one metastable state and lower electrical resistance in other metastable state, with switching from one state to the other upon application to the electrodes of an electrical signal of appropriate polarity, amplitude and duration;

said first region being formed of a material based tellurium and activated by a 2.5% to 4.5% of electrically active donor impurity;

said third region being formed of a material having approximately equal percentages of tellurium and germanium or tellurium and stanus and containing inside an intermediate thin film of dielectric with a quantity of a fitted negative charge; and said second region being formed as the result of a mutual diffusion of the main constituents of the first and third regions and having a higher percentage of tellurium than said third region.

* * * * *